(12) United States Patent
Tsorng et al.

(10) Patent No.: US 11,428,250 B2
(45) Date of Patent: Aug. 30, 2022

(54) ALIGNMENT MECHANISM FOR REMOVABLE MODULE

(71) Applicant: Quanta Computer Inc., Taoyuan (TW)

(72) Inventors: Yaw-Tzorng Tsorng, Taoyuan (TW); Hung-Wei Chen, Taoyuan (TW); Chun Chang, Taoyuan (TW); Ming-Lung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 139 days.

(21) Appl. No.: 16/738,552

(22) Filed: Jan. 9, 2020

(65) Prior Publication Data

US 2021/0216114 A1 Jul. 15, 2021

(51) Int. Cl.
*F16B 2/22* (2006.01)
*H05K 7/12* (2006.01)
*G06F 1/18* (2006.01)

(52) U.S. Cl.
CPC ............... *F16B 2/22* (2013.01); *H05K 7/12* (2013.01); *G06F 1/181* (2013.01); *G06F 1/183* (2013.01); *G06F 1/187* (2013.01); *G06F 1/188* (2013.01)

(58) Field of Classification Search
CPC ... F16B 2/22; F16B 2/243; H05K 7/12; G06F 1/181; G06F 1/183; G06F 1/187; G06F 1/188
USPC ...... 248/27.1; 312/223.2, 319.1, 334.46, 333
See application file for complete search history.

(56) References Cited

U.S. PATENT DOCUMENTS

| | | | | | |
|---|---|---|---|---|---|
| 6,115,242 | A | * | 9/2000 | Lambrecht | G06F 1/20 257/686 |
| 6,166,900 | A | * | 12/2000 | Flynn | G11B 33/08 248/638 |
| 7,045,705 | B2 | * | 5/2006 | Ikeda | H02G 11/006 174/21 R |
| 7,319,595 | B2 | * | 1/2008 | Liang | H05K 7/1487 361/725 |
| 9,873,530 | B2 | * | 1/2018 | Dittus | B65B 5/04 |
| 2006/0039123 | A1 | * | 2/2006 | Malagrino, Jr. | G02B 6/4256 361/727 |

* cited by examiner

*Primary Examiner* — Kimberly T Wood
(74) *Attorney, Agent, or Firm* — Nixon Peabody LLP

(57) ABSTRACT

An electronic device includes a chassis housing one or more electronic components, a module configured to be inserted into a channel defined by the chassis, and an alignment mechanism disposed in the channel. The alignment mechanism has a body portion that defines an aperture. When the module is initially inserted into the channel in a first orientation, a first portion of the module passes over the aperture and compresses the body portion of the alignment mechanism along a first axis, to allow the module to be fully inserted into the channel. When the module is initially inserted into the channel in a second orientation, a second portion of the module passes through the aperture and does not compress the body portion of the alignment mechanism along the first axis, to prevent the module from being fully inserted into the channel.

15 Claims, 8 Drawing Sheets

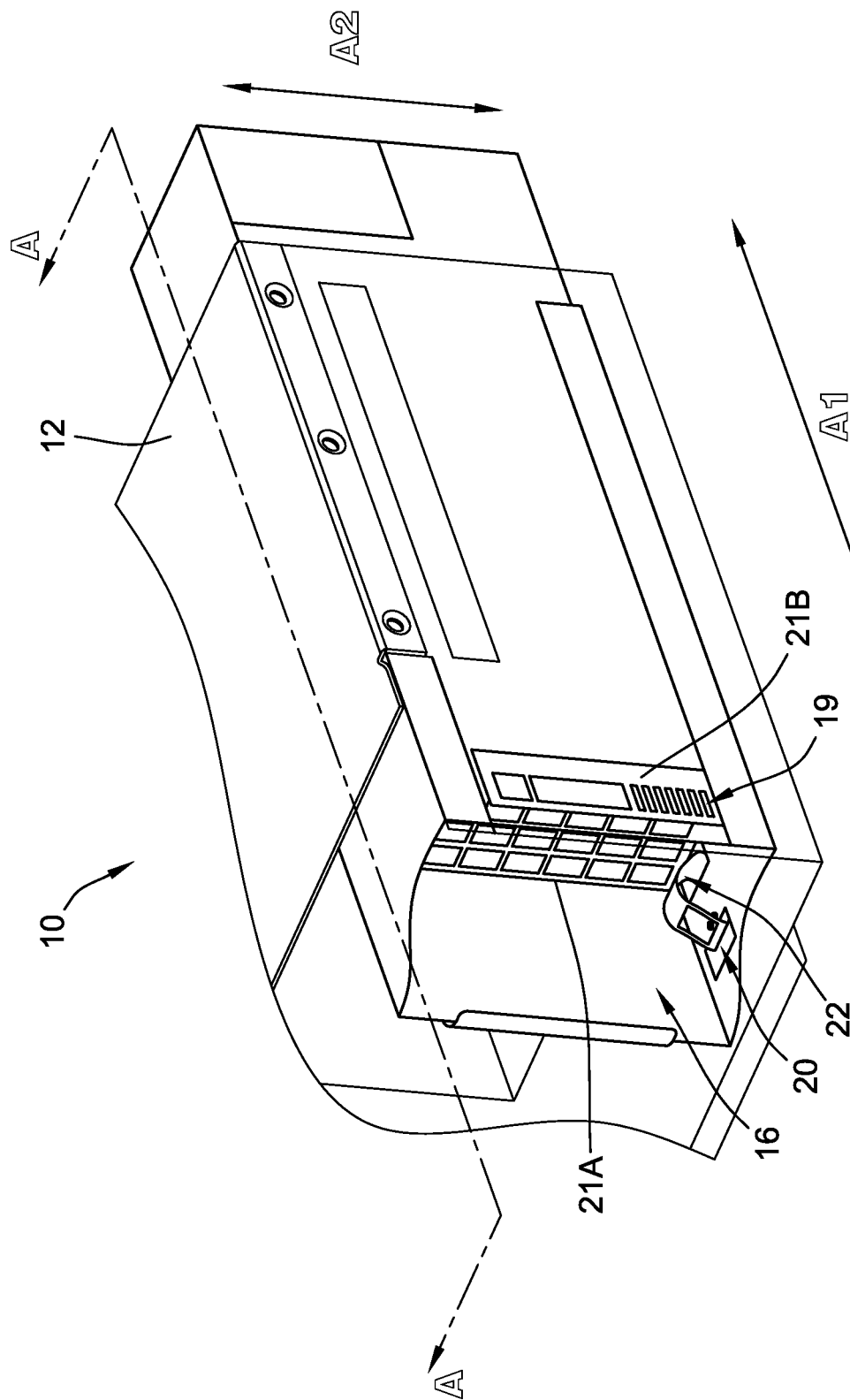

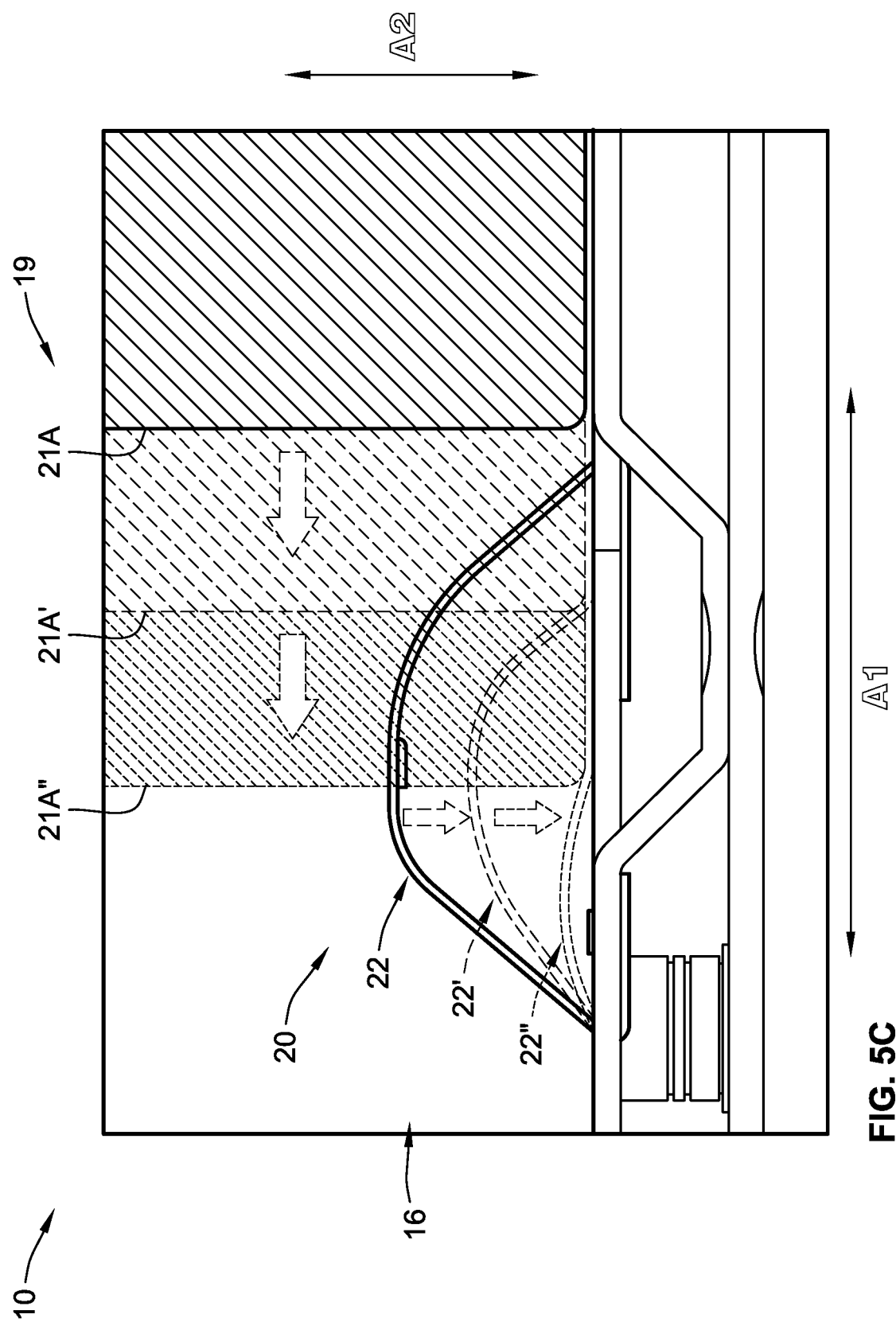

ALIGNMENT MECHANISM FOR REMOVABLE MODULE

TECHNICAL FIELD

The present disclosure relates generally to an alignment mechanism for aligning a module within a chassis. More particularly, aspects of this disclosure relate to an alignment mechanism that allows the module to be inserted into the chassis in a correct orientation, and prevents the module from being inserted into the chassis in an incorrect orientation.

BACKGROUND

Electronic devices, such as servers, comprise a number of electronic components housed in a chassis. The chassis will also include a channel or other space into which various modules can be inserted. The modules can be electrically connected to the electronic components in the chassis to perform various functions. Due to the layout of the various electronic components and space limitations, the modules can be inserted into the channel in more than one orientation. However, there is generally only one correct orientation where the modules can be inserted and electrically connected to the electronic components. In other orientations, the modules can be inserted but cannot be electrically connected to the electronic components. The multiple orientations in which the modules can be inserted into the chassis can result in uncertainty as to whether the electronic device has been assembled correctly, and can cause numerous manufacturing delays and inefficiencies. Thus, there is a need for a mechanism to ensure that the modules are inserted into the chassis in the correct orientation.

SUMMARY

The various examples of the present disclosure are directed toward devices and systems for aligning a module in a channel of a chassis. In a first embodiment of the present disclosure, an alignment mechanism for aligning a module within a chassis comprises a body portion forming an arch with a first end and a second end. The body portion extends between the first end and the second end along a first axis. The body portion further extends away from the first end and the second end along a second axis that is generally perpendicular to the first axis. The body portion is made from a deformable material. The body portion is configured to compress along the second axis toward the first end and the second end in response to contact between the body portion and a first portion of the module. The body portion is further configured to not compress along the second axis toward the first end and the second end in response to contact between the body portion and a second portion of the module.

In some examples of the first embodiment, the alignment mechanism includes a first base portion coupled to the first end, and a second base portion coupled to the second end.

In some example of the first embodiment, the first base portion extends along the first axis away from the first end of the body portion, and toward the second end of the body portion.

In some examples of the first embodiment, the second base portion extends along the first axis away from the second end of the body portion, and toward the first end of the body portion.

In some examples of the first embodiment, the first end is coupled to the chassis and is fixed relative to the chassis. The second end is not coupled to the chassis and is moveable relative to the chassis.

In some examples of the first embodiment, the compression of the body portion along the second axis toward the first end and the second end causes the second end to move along the first axis, away from the first end.

In some examples of the first embodiment, the alignment mechanism is formed from sheet metal, and the module is one of a power supply unit, a hard drive, or a PCIe module.

In a second embodiment of the present disclosure, a system comprises a chassis, a channel, and an alignment mechanism disposed in the channel. The chassis is configured to house one or more electronic components. The channel is defined by the chassis and is configured to receive a module along a first axis. The alignment mechanism includes a body portion forming an arch with a first end and a second end. The body portion extends between the first end and the second end along the first axis. The body portion further extends away from the first end and the second end along a second axis that is generally perpendicular to the first axis. The body portion is made from a deformable material. The alignment mechanism is configured to allow the module to be fully inserted into the channel, in response to the module being initially inserted into the channel in a first orientation. The alignment mechanism is further configured to prevent the module from being fully inserted into the channel in response to the module being initially inserted into the channel in a second orientation.

In some examples of the second embodiment, the body portion is configured to compress along the second axis toward the first end and the second end, in response to the module being initially inserted into the chassis in the first orientation. The body portion is further configured to not compress along the second axis, in response to the module being initially inserted into the chassis in the second orientation.

In some examples of the second embodiment, an aperture is defined in the body portion of the alignment mechanism. The aperture is aligned with a first portion of the module when the module is initially inserted into the channel in the first orientation. The aperture is aligned with a second portion of the module when the module is initially inserted into the channel in the second orientation.

In some examples of the second embodiment, the aperture, the first portion of the module, and the second portion of the module each have a thickness defined along a third axis. The third axis generally perpendicular to the first axis and the second axis.

In some examples of the second embodiment, the thickness of the first portion of the module is larger than the thickness of the aperture, and the thickness of the second portion of the module is smaller than the thickness of the aperture.

In some examples of the second embodiment, the first portion of the module is configured to slide along an outer surface of the body portion and past the aperture, in response to the module being initially inserted into the channel in the first orientation.

In some examples of the second embodiment, the first portion of the module imparts a force onto the body portion along the second axis as the first portion of the module slides along the outer surface of the body portion, to thereby compress the body portion along the second axis and allow the module to be fully inserted into the channel In some examples of the second embodiment, the second portion of the module is configured to pass into the aperture of the alignment mechanism, in response to the module being inserted into the channel in the second orientation.

In some examples of the second embodiment, the second portion of the module imparts a force onto a laterally-facing surface of the body portion along the first axis, as the second portion of the module passes into the aperture in the body portion. The alignment mechanism contacts a laterally-facing edge of the chassis and prevents the module from being fully inserted into the channel along the first axis.

In some examples of the second embodiment, the module is one of a power supply unit, a hard drive, or a PCIe module.

In a third embodiment of the present disclosure, an insertion control mechanism comprises a mechanical stop that is deployable within a channel of a chassis. The mechanical stop includes a first surface and a second surface. The first surface of the mechanical stop is positioned such that when the module is inserted into the channel in a first orientation, the first surface of the mechanical stop contacts a first portion of the module before the second surface of the mechanical stop. The mechanical stop moves into a deflected configuration in response to force being applied to the first surface of the mechanical stop by the first portion of the module. The second surface of the mechanical stop is positioned such that when the module is inserted into the channel in a second orientation, the second surface of the mechanical stop contacts a second portion of the module before the first surface of the mechanical stop. The mechanical stop moves into a deployed configuration in response to force being applied to the second surface of the mechanical stop by the second portion of the module.

In some examples of the third embodiment, the module is one of a power supply unit, a hard drive, or a PCIe module.

In some examples of the third embodiment, the mechanical stop comprises an elastic material, and movement of the mechanical stop between the deployed configuration and the deflected configuration comprises flexion of the elastic material.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 5A is an axonometric view of a module partially inserted into a channel of a chassis in a first orientation, according to certain aspects of the present disclosure;

FIG. 5C is a zoomed-in cross-sectional view, taken across line A:A of FIG. 5A, of the first portion of the module of FIG. 5A contacting the alignment mechanism when the module is partially inserted into the channel of the chassis in the first orientation, according to certain aspects of the present disclosure;

Figure 1:
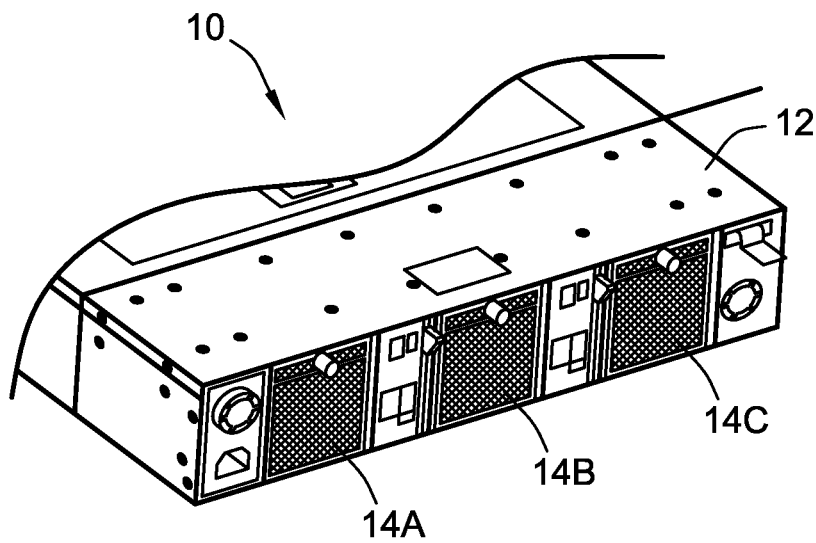
FIG. 1 is an axonometric view of a chassis housing one or more modules, according to certain aspects of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

FIG. 1 shows an electronic device 10, which may be a server or other computing device. The electronic device includes a chassis 12, a number of internal electronic components (not shown) positioned in the chassis 12, and a plurality of removable modules 14A, 14B, 14C positioned in the chassis 12. The internal electronic components can be standard computing components, such as motherboards, processors, memory device, etc.

The modules 14A, 14B, 14C can be any type of removable electronic or computing component that is generally used in a server or other computing device. For example, the modules 14A, 14B, 14C can include power supply units, hard drives, PCIe modules, etc. The modules 14A, 14B, 14C can be added to and removed from the electronic device 10 as necessary for the operation of the electronic device 10. When the modules 14A, 14B, 14C are added to the electronic device 10, the modules 14A, 14B, 14C can be electrically connected to the internal electronic components positioned in the chassis 12.

Figure 2:
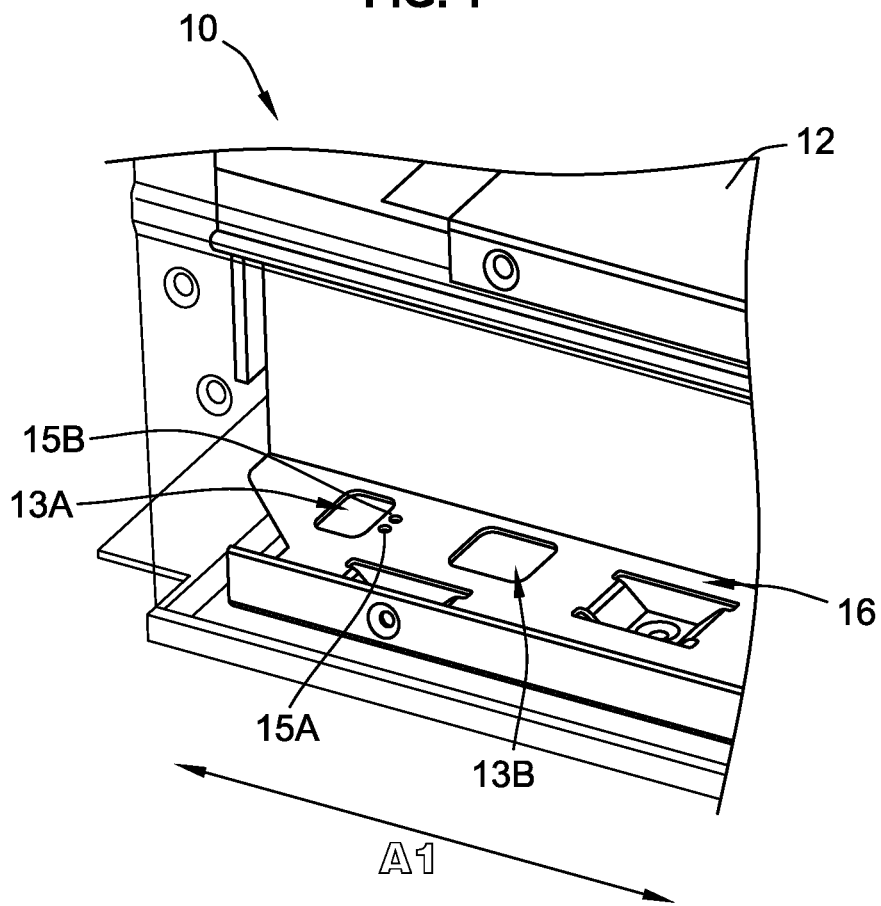
FIG. 2 is an axonometric view of a channel defined by the chassis of FIG. 1, according to certain aspects of the present disclosure.

FIG. 2 shows a channel 16 defined by the chassis 12 of the electronic device 10. The modules 14A, 14B, 14C (FIG. 1) are inserted into the channel 16 when they are added to the electronic device 10. The modules 14A, 14B, 14C are generally inserted into and removed from the channel 16 along a first axis A1. In some implementations, the electronic device 10 is designed so that the modules 14A, 14B, 14C are automatically electrically connected to the required internal electronic components when the modules 14A, 14B, 14C are inserted into the channel 16. In other implementations, the modules 14A, 14B, 14C must be manually electrically connected to the required electronic components after the modules 14A, 14B, 14C are inserted into the channel 16. The bottom of the chassis 12 defines various apertures 13A, 13B, 15A, and 15B that are used to couple an alignment mechanism (FIG. 3) to the chassis 12 within the channel 16.

Due to various design constraints, the channel 16 is normally formed so that the modules 14A, 14B, 14C can be physically inserted into the channel 16 in multiple different orientations. However, only one of these orientations is considered the correct orientation. In the correct orientation, the modules 14A, 14B, 14C can be electrically connected to the internal electronic components. In the other incorrect orientations, the modules 14A, 14B, 14C can be inserted into the channel 16, but cannot be electrically connected to the internal electronic components.

Figure 3:
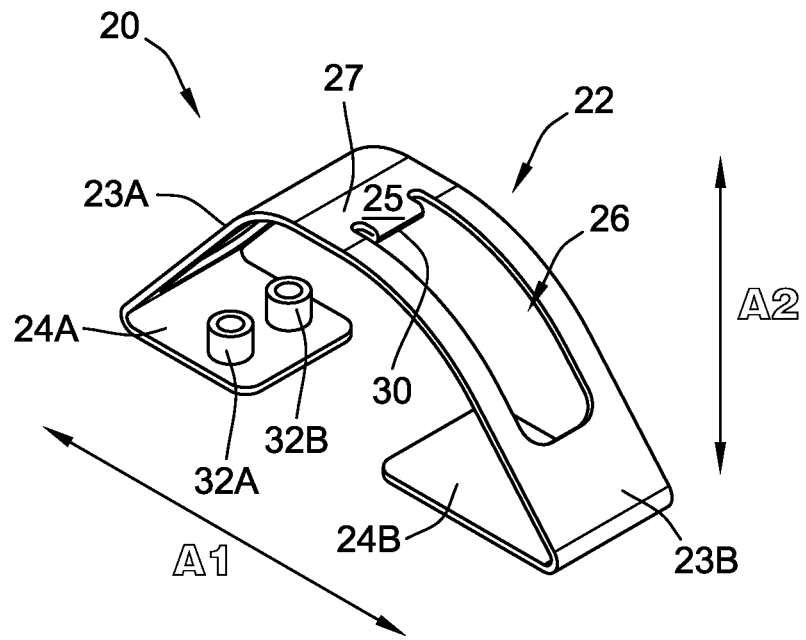
FIG. 3 is an axonometric view of an alignment mechanism for aligning a module within a channel defined by a chassis, according to certain aspects of the present disclosure.

FIG. 3 shows an alignment mechanism 20 that prevents the modules 14A, 14B, 14C (FIG. 1) from being inserted into the channel 16 (FIG. 2) in an incorrect orientation. The alignment mechanism 20 (alternatively referred to as a "mechanical stop") has a body portion 22, a first base portion 24A, and a second base portion 24B. A first end 23A of the body portion 22 is coupled to the first base portion 24A. A second end 23B of the body portion 22 is coupled to the second base portion 24B. The body portion 22 is generally formed as an arch shape, with a corresponding arch-shaped outer surface 25.

The body portion 22 extends along the first axis A1 between (i) the first end 23A and the first base portion 24A, and (ii) the second end 23B and the second base portion 24A. The body portion 22 also extends along a second axis A2 away from (i) the first end 23A and the first base portion 24A, and (ii) the second end 23B and the second base portion 24A. The second axis A2 is generally perpendicular to the first axis A1. The highest point on the body portion, e.g., the top of the arch, is referred to as the apex 27. At the apex 27, the body portion 22 is generally flat. The outer surface 25 at the apex 27 therefore faces away from the first base portion 24A and the second base portion 24B along the second axis A2. With respect to the orientation of FIG. 3, the outer surface 25 at the apex 27 thus faces upward. In some implementations, the outer surface 25 at the first end 23A and the second end 23B faces laterally along the first axis A1. In other implementations, the outer surface 25 at the first end 23A and the second end 23B faces at an angle between the first axis A1 and the second axis A2.

FIG. 3 shows the alignment mechanism in a deployed configuration. The alignment mechanism 20 is generally made from a deformable material. Thus, when a certain force is applied to the alignment mechanism 20, the alignment mechanism can flex or deform from the deployed configuration to a deflected configuration (see FIG. 5C). In some implementations, the alignment mechanism 20 is formed from a resilient or elastic material, such that the alignment mechanism automatically returns to the deployed configuration when the force is removed. The deformable material can be sheet metal, a plastic, a polymer, or any other suitable material.

The alignment mechanism 20 can be formed from a single unitary piece of the deformable material. For example, the first base portion 24A and the second base portion 24B may be part of the same single piece of material as the body portion 22. Alternatively, the alignment mechanism 20 can be formed from multiple separate pieces of the deformable material that are coupled or otherwise joined together. For example, the first base portion 24A and the second base portion 24B can be separate pieces from the body portion 22. After the body portion 22 is formed, the first base portion 24A and the second base portion 24B are coupled to the first end 23A and the second end 23B.

The body portion 22 defines an aperture 26 on a side of the alignment mechanism 20 between the apex 27 and the second end 23B. The aperture 26 has a curved shape that generally follows the arch shape of the body portion 22. The upper portion of the aperture 26 terminates near the apex 27 of the body portion 22. The opposite lower portion of the aperture 26 terminates near the second base portion 24B. The transition between the upper portion of the aperture 26 and the apex 27 of the body portion 22 forms a laterally-facing surface 30 that faces along the first axis A1. The laterally-facing surface 30 is generally perpendicular to the outer surface 25 of the body portion 22 at the apex 27, where the outer surface 25 generally faces upward along the second axis A2.

The first base portion 24A extends along the first axis A1 away from the first end 23A towards the second end 23B. Similarly, the second base portion 24B extends along the first axis A1 towards the first end 23A. The first base portion 24A includes a mounting mechanism used to couple the first base portion 24A to the chassis 12. In the implementation illustrated in FIG. 3, the mounting mechanism includes mounting bosses 32A, 32B that extend from the first base portion 24A.

Figure 4:
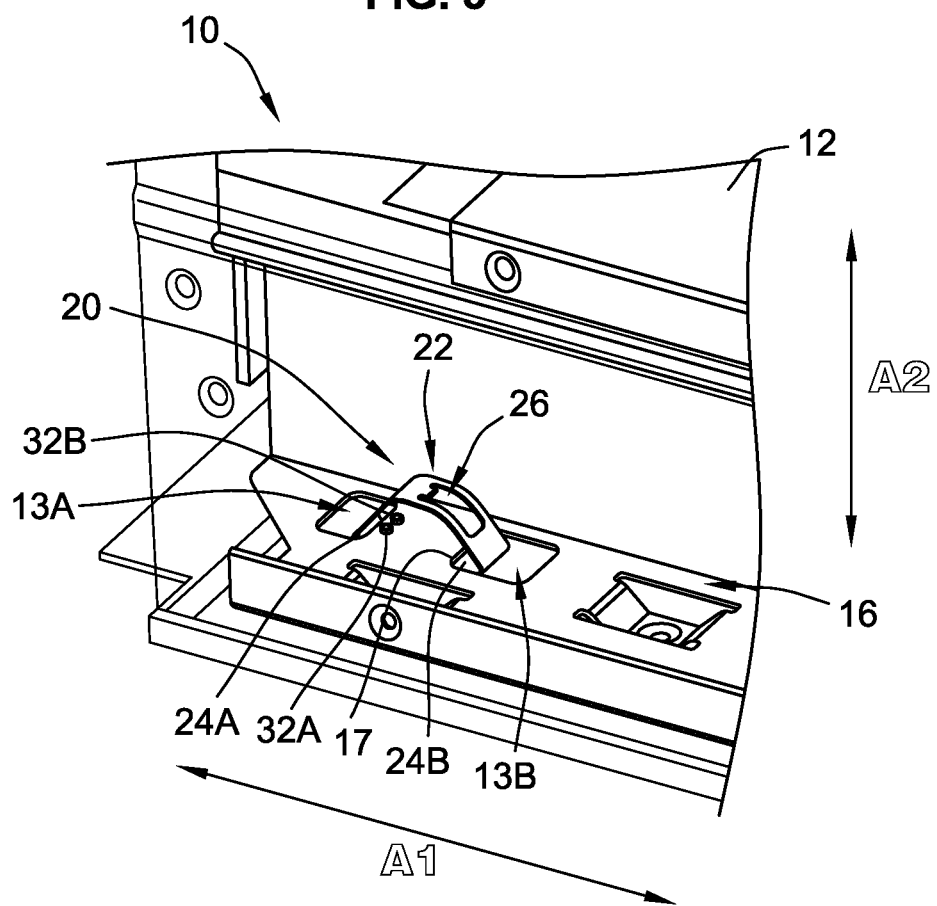
FIG. 4 is an axonometric view of the alignment mechanism of FIG. 3 positioned within a channel of a chassis, according to certain aspects of the present disclosure.

FIG. 4 shows the alignment mechanism 20 of FIG. 3 in the deployed configuration and positioned in the channel 16. The first base portion 24A is inserted through the aperture 13A in the chassis 12 and extends underneath the chassis 12. The mounting bosses 32A, 32B are inserted upwards through corresponding mounting apertures 15A, 15B (FIG. 2) in the chassis 12, to couple the first base portion 24A to the chassis 12. The second base portion 24B extends through the aperture 13B in the chassis 12, and also extends underneath the chassis 12. However, the second base portion 24B is not coupled to the chassis 12. Thus, the first base portion 24A is fixed relative to the chassis 12, while the second base portion 24B is freely moveable relative to the chassis 12.

When a module (such as modules 14A, 14B, 14C of FIG. 1) is inserted into the channel 16 in the incorrect orientation, the module presses against the alignment mechanism 20 and causes the second base portion 24B to move along the first axis A1 toward the first base portion 24A. As the second base portion 24B moves, a laterally-facing edge 17 of the chassis 12 near aperture 13B contacts the alignment mechanism 20. This contact prevents the second base portion 24B from moving any further, and also prevents the module from being inserted into the channel 16 any further. The mounting bosses 32A, 32B that are inserted through the mounting apertures 15A, 15B also assist in preventing the module from being inserted into the channel 16 any further.

Figure 5B:
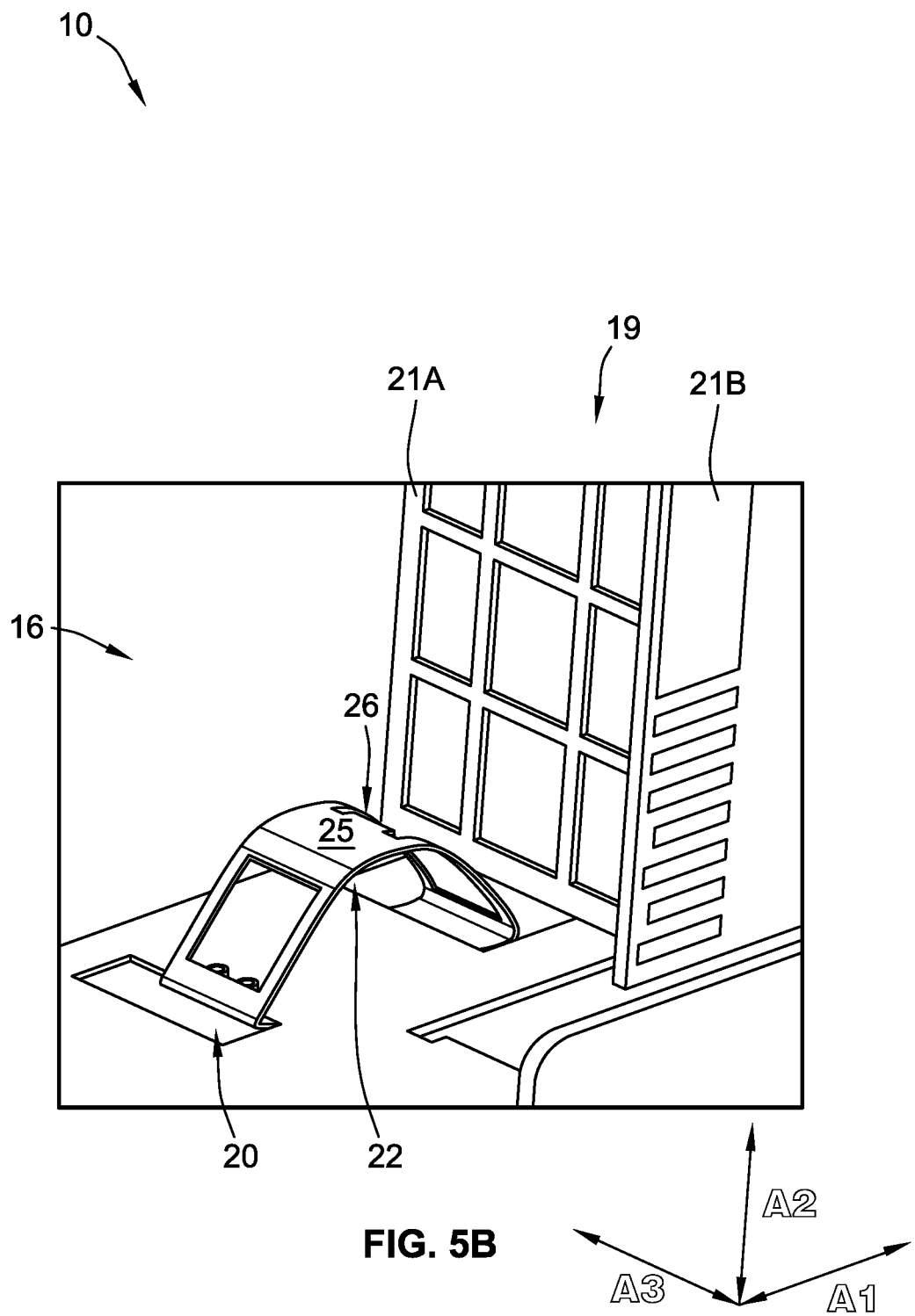
FIG. 5B is a zoomed-in axonometric view of a first portion of the module of FIG. 5A contacting an alignment mechanism when the module is partially inserted into the channel of the chassis in the first orientation, according to certain aspects of the present disclosure.

FIGS. 5A and 5B show a module 19 (which may be the same as or similar to modules 14A, 14B, 14C of FIG. 1) being inserted into the channel 16 in the correct orientation. FIG. 5C shows a zoomed-in cross sectional view of the module 19 contacting the alignment mechanism 20, as the module 19 is inserted into the channel 16 in the correct orientation. The view in FIG. 5C is taken across line A:A in FIG. 5A. The module 19 includes a first portion 21A and a second portion 21B. When the module 19 is inserted in the correct orientation, the first portion 21A is aligned with the alignment mechanism 20 and its aperture 26 (FIG. 5B), while the second portion 21B is offset from the alignment mechanism 20 and its aperture 26.

The first portion 21A of the module 19 has a width extending along a third axis A3 (best shown in FIG. 5B). The third axis A3 is generally perpendicular to both the first axis A1 and the second axis A2. The width of the first portion 21A is larger than a width of the aperture 26 of the alignment mechanism 20. As the module 19 continues to be inserted into the channel 16, the first portion 21A of the module 19 contacts the alignment mechanism 20. Because the width of the first portion 21A is larger than the width of the aperture 26, the first portion 21A does not pass into the aperture 26. Instead, the first portion 21A slides along the outer surface 25 of the alignment mechanism 20. Thus, the outer surface 25 of the alignment mechanism 20 contacts the first portion 21A of the module 19 before the laterally-facing surface 30 contacts the first portion 21A.

The contact between the first portion 21A and the outer surface 25 imparts a downward force on the body portion 22 as the module 19 continues to be inserted into the channel 16. Because the outer surface 25 of the body portion 22 is curved, this downward force compresses the body portion 22 along the second axis A2, e.g., downward with respect to the orientation of FIG. 5C. Because the second base portion 24A is moveable relative to the chassis 12, the body portion 22 flattens out, and the second base portion 24A moves away from the first base portion 24B. Dashed versions 20' and 21A' show the alignment mechanism 20 and the first portion 21A as the first portion 21A begins to flatten the alignment mechanism 20.

As the alignment mechanism 20 continues to flatten, the module 19 can continue to travel over the alignment mechanism 20 and further into the channel 16. Dashed versions 20" and 21A" show the alignment mechanism 20 and the first portion 21A as the first portion 21A has been substantially inserted into the channel 16 the desired amount. Thus, the contact between the first portion 21A of the module 19 and the body portion 22 of the alignment mechanism 20 moves the alignment mechanism 20 from the deployed configuration to the deflected configuration. The deployed configuration is shown in FIGS. 5A, 5B, and 5C. The deflected configuration is shown with dashed versions 20" and 21A" of the alignment mechanism 20 and the first portion 21A in FIG. 5C.

As shown in FIG. 5C, the elastic material of the alignment mechanism 20 undergoes flexion as the alignment mechanism 20 moves from the deployed configuration to the deflected configuration (20' and 20"). In the deflected configuration, the body portion 22 is flattened to allow the module 19 to be fully inserted into the channel 16. Thus, when the first portion 21A of the module 19 contacts the outer surface 25 of the alignment mechanism 20, the alignment mechanism 20 flexes to the deflected configuration. In the deflected configuration, the module 19 can be fully inserted into the channel 16. While FIG. 5C shows the deflected configuration as requiring a specific amount of compression (e.g., flattening) of the alignment mechanism 20, generally any compressed (e.g., flattened) position of the alignment mechanism 20 sufficient to allow insertion of the module 19 into the channel 16 to the desired depth can be considered to be the deflected configuration.

Figure 6A:
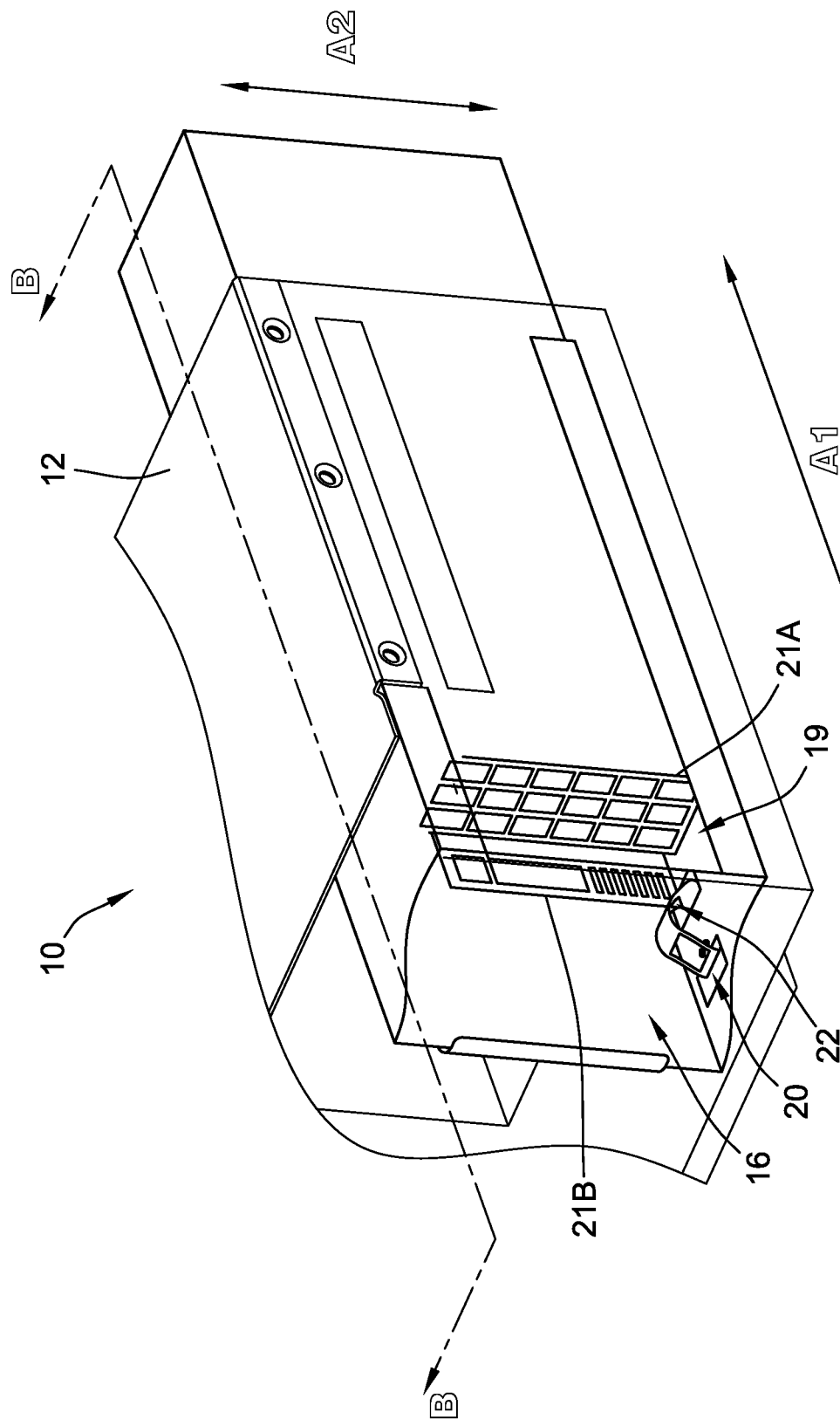
FIG. 6A is an axonometric view of a module partially inserted into a channel of a chassis in a second orientation, according to certain aspects of the present disclosure.
Figure 6B:
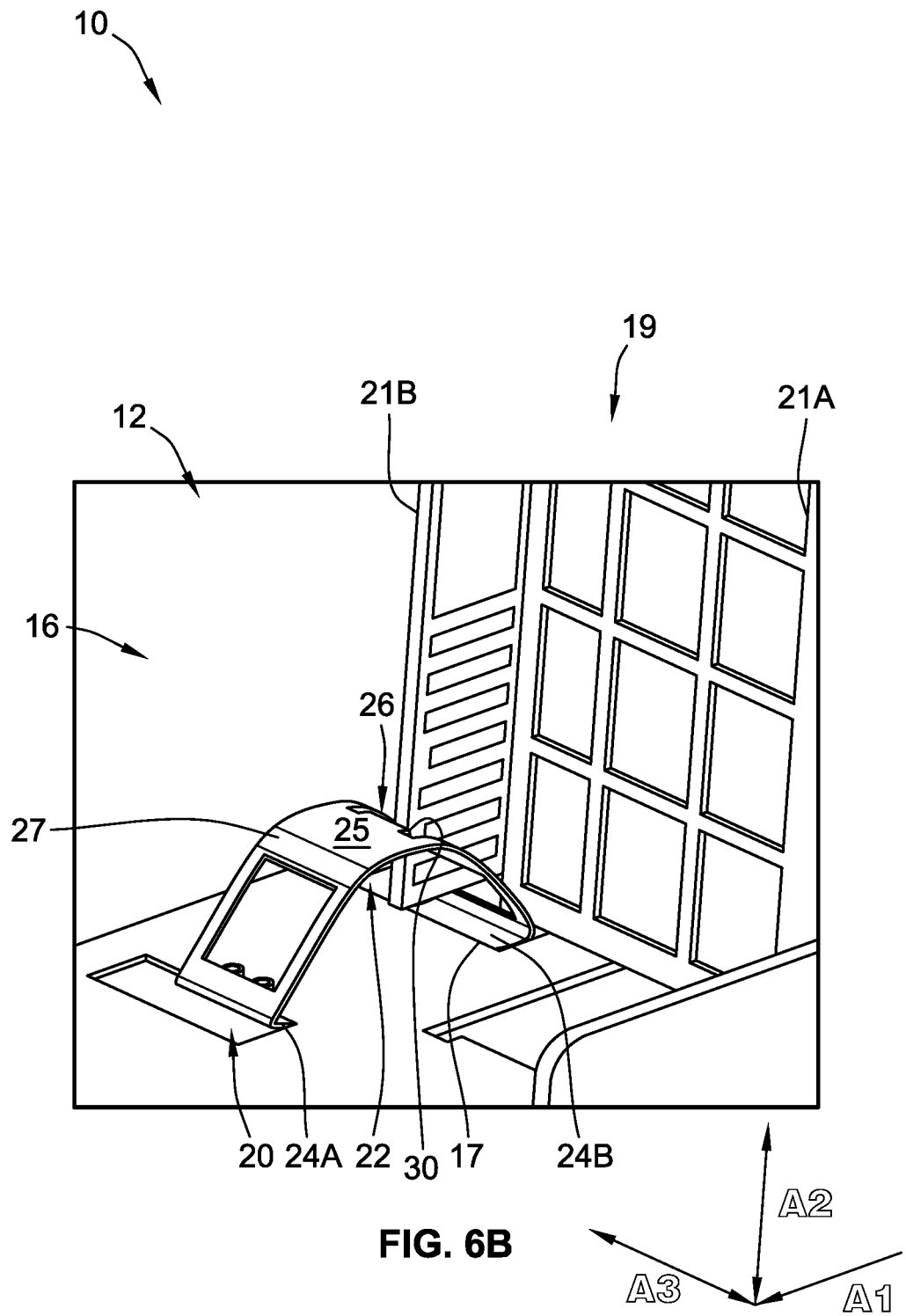
FIG. 6B is a zoomed-in axonometric view of a second portion of the module of FIG. 6A contacting an alignment mechanism when the module is partially inserted into the channel of the chassis in the second orientation, thereby preventing full insertion of the module, according to certain aspects of the present disclosure.
Figure 6C:
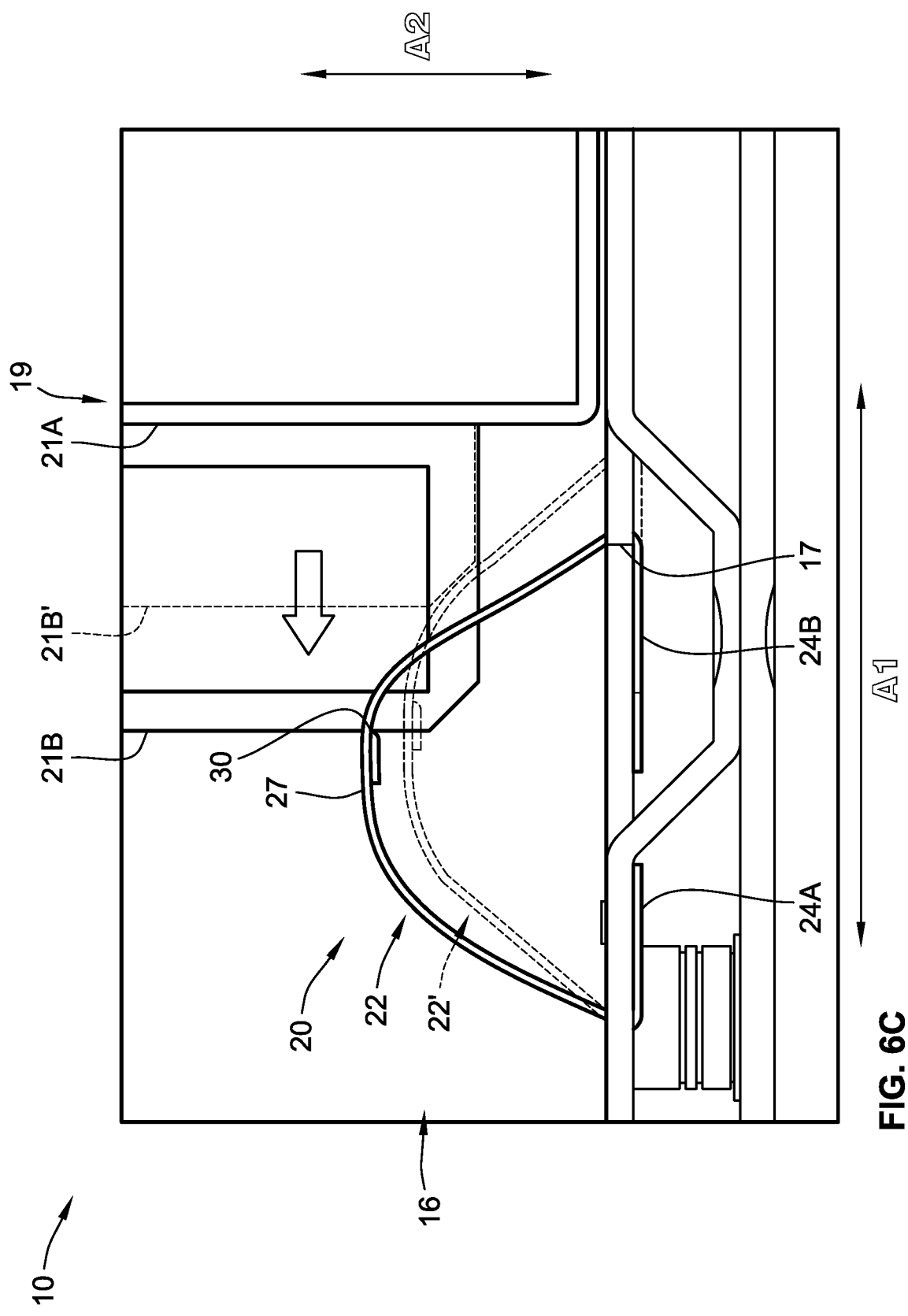
FIG. 6C is a zoomed-in cross-sectional view, taken across lines B:B of FIG. 6A, of the second portion of the module of FIG. 6A contacting the alignment mechanism when the module is partially inserted into the channel of the chassis in the second orientation, thereby preventing full insertion of the module, according to certain aspects of the present disclosure.

FIGS. 6A and 6B show the module 19 being inserted into the channel 16 in the incorrect orientation. FIG. 6C shows a zoomed-in cross sectional view of the module 19 contacting the alignment mechanism 20, as the module 19 is inserted into the channel in the incorrect orientation. The view in FIG. 6C is taken across line B:B in FIG. 6A. As best shown in FIG. 6B, when the module 19 is inserted in the incorrect orientation, the second portion 21B is aligned with the alignment mechanism 20 and its aperture 26, while the first portion 21A is offset from the alignment mechanism 20 and its aperture 26.

The width of the second portion 21B is smaller than the width of the aperture 26 of the alignment mechanism 20 (as best shown in FIG. 6B). As the module 19 continues to be inserted into the channel 16, the second portion 21B of the module 19 contacts the alignment mechanism 20. Because the width of the second portion 21B is smaller than the width of the aperture 26, the second portion 21B passes into the aperture 26, instead of sliding along the outer surface 25 of the alignment mechanism 20.

The module 19 can continue to be inserted until the second portion 21B contacts the laterally-facing surface 30 of the alignment mechanism 20. The laterally-facing surface 30 of the alignment mechanism 20 thus contacts the second portion 21B of the module 19 before the outer surface 25 contacts the second portion 21B. This contact between the second portion 21B and the laterally-facing surface 30 imparts a sideways force on the body portion 22 along the first axis A1, e.g., sideways with respect to the orientation of FIG. 6C.

In the implementation illustrated in FIGS. 6B and 6C, the second base portion 24B is spaced apart from the laterally-facing edge 17 of the chassis 12. Thus, in these implementation, the sideways force imparted onto the body portion 22 slightly compresses the alignment mechanism 20 along the axis A1. The second base portion 24A moves toward the first base portion 24B, until the second base portion 24B contacts the laterally-facing edge 17 of the chassis 12. Once the second base portion 24B contacts the laterally-facing edge 17 of the chassis 12, the second base portion 24B stops moving. Because the alignment mechanism 20 cannot be compressed along the first axis A1 any further, the alignment mechanism 20 prevents the module 19 from being fully inserted into the channel 16 when in the incorrect orientation. Thus, in the implementation illustrated in FIGS. 6B and 6C, the deployed configuration includes both when the alignment mechanism 20 is not compressed, and when the alignment mechanism 20 is slightly compressed against the laterally-facing edge 17 of the chassis 12. In FIG. 6C, the position of the slightly-compressed alignment mechanism 20 is shown with dashed versions 20' and 21W of the alignment mechanism 20.

In other implementations, the second base portion 24B already contacts the laterally-facing edge 17 of the chassis 12 prior to the module 19 being inserted into the channel 16. Thus, in these implementations, the sideways force imparted by the second portion 21B of the module 19 cannot compress the alignment mechanism 20 any further. Once the module 19 is inserted, contact between the second portion 21B and the alignment mechanism 20 prevents the alignment mechanism 20 from being compressed along the axis A1. The alignment mechanism 20 thus prevents the module 19 from being fully inserted into the channel 16 when in the incorrect orientation.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An alignment mechanism for aligning a module within a chassis, comprising:
    a body portion forming an arch with a first end and a second end, the body portion extending (i) between the first end and the second end along a first axis, and (ii) away from the first end and the second end along a second axis that is generally perpendicular to the first axis, the body portion being made from a deformable material; and
    an aperture defined in the arch of the body portion between the first end and the second end, the aperture being sized to receive a second portion of the module therein but not a first portion of the module,
    wherein in response to the body portion contacting the first portion of the module, the body portion compresses along the second axis toward the first end and the second end such that the body portion flattens out, and
    wherein in response to the body portion contacting the second portion of the module, the aperture defined in the arch of the body portion receives the second portion of the module and the body portion compresses along the first axis, such that the first end and second end travel toward each other.

2. The alignment mechanism of claim 1, wherein the alignment mechanism includes a first base portion coupled to the first end, and a second base portion coupled to the second end.

3. The alignment mechanism of claim 2, wherein the first base portion extends along the first axis away from the first end of the body portion and toward the second end of the body portion.

4. The alignment mechanism of claim 3, wherein the second base portion extends along the first axis away from the second end of the body portion and toward the first end of the body portion.

5. The alignment mechanism of claim 1, wherein the first end is configured to be coupled to the chassis such that the first end is fixed relative to the chassis, and wherein the second end is not configured to be coupled to the chassis such that the second end is moveable relative to the chassis.

6. The alignment mechanism of claim 5, wherein the compression of the body portion along the second axis toward the first end and the second end causes the second end to move along the first axis away from the first end.

7. The alignment mechanism of claim 1, wherein the alignment mechanism is formed from sheet metal, and wherein the module is one of a power supply unit, a hard drive, or a PCIe module.

8. The alignment mechanism of claim 1, wherein:
    the alignment mechanism is configured to allow the module to be fully inserted into the chassis, in response to the module being initially inserted into the chassis in a first orientation, and
    the alignment mechanism is configured to prevent the module from being fully inserted into the chassis, in response to the module being initially inserted into the chassis in a second orientation.

9. The alignment mechanism of claim 8, wherein the body portion is configured to compress along the second axis toward the first end and the second end in response to the module being initially inserted into the chassis in the first orientation, and wherein the body portion is further configured to not compress along the second axis in response to the module being initially inserted into the chassis in the second orientation.

10. The alignment mechanism of claim 1, wherein the aperture, the first portion of the module, and the second portion of the module each have a thickness defined along a third axis that is generally perpendicular to the first axis and the second axis.

11. The alignment mechanism of claim 10, wherein the thickness of the first portion of the module is larger than the thickness of the aperture, and wherein the thickness of the second portion of the module is smaller than the thickness of the aperture.

12. The alignment mechanism of claim 11, wherein the first portion of the module is configured to slide along an outer surface of the body portion and past the aperture, in response to the module being initially inserted into the chassis in the first orientation.

13. The alignment mechanism of claim 12, wherein the first portion of the module imparts a force onto the body portion along the second axis as the first portion of the module slides along the outer surface of the body portion, to thereby compress the body portion along the second axis and allow the module to be fully inserted into the chassis.

14. The alignment mechanism of claim 11, wherein the second portion of the module is configured to pass into the aperture of the alignment mechanism, in response to the module being inserted into the chassis in the second orientation.

15. The alignment mechanism of claim 14, wherein the second portion of the module imparts a force onto a laterally-facing surface of the body portion along the first axis as the second portion of the module passes into the aperture in the body portion, such that the alignment mechanism contacts a laterally-facing edge of the chassis and prevents the module from being fully inserted into the chassis along the first axis.

* * * * *